United States Patent [19]

Karabed et al.

[11] Patent Number: 4,870,414
[45] Date of Patent: Sep. 26, 1989

[54] EVEN MARK MODULATION CODING METHOD

[75] Inventors: Razmik Karabed; Paul H. Siegel, both of San Jose, Calif.

[73] Assignee: International Business Machines Corporation, Armonk, N.Y.

[21] Appl. No.: 169,918

[22] Filed: Mar. 18, 1988

[51] Int. Cl.[4] .............................................. H03M 7/00
[52] U.S. Cl. ........................................ 341/57; 341/106
[58] Field of Search ...................... 341/58, 59, 67, 94, 341/106; 360/40

[56] References Cited

U.S. PATENT DOCUMENTS

| | | | |
|---|---|---|---|
| 3,995,264 | 11/1976 | Ouchi | 341/67 |
| 4,413,251 | 11/1983 | Adler et al. | 340/347 DD |
| 4,488,142 | 12/1984 | Franaszek | 341/59 |
| 4,502,036 | 2/1985 | Furukawa | 341/106 |
| 4,609,907 | 9/1986 | Adler et al. | 341/106 |
| 4,688,016 | 8/1987 | Fok | 341/59 |

*Primary Examiner*—William M. Shoop, Jr.
*Assistant Examiner*—Marc S. Hoff
*Attorney, Agent, or Firm*—Henry E. Otto, Jr.

[57] ABSTRACT

A method termed Even Mark Modulation (EMM) is disclosed for coding input strings for input-restricted $(1+D)$ or $(1+D)^2$ partial response channels that require at least one pair of consecutive signals of one state in order to record or transmit data to a receiving device. EMM provides improved coding gains and is especially suitable for optical recording.

An input string is encoded into a binary code string in which all one-state signals (e.g., "1's") are in the form of runs of at least one contiguous pair; however, signals of an opposite state (e.g., "0's") may be of any length or duration. The EMM signals are detected with a maximum likelihood detector using an algorithm based on a three-state trellis structure for $(1+D)$ channels and a five-state trellis structure for $(1+D)^2$ channels adapted to the particular partial response channel. In a preferred embodiment, the coding rate is ⅔ and the coding gain is at least 3 dB unnormalized and at least 2.2 dB when normalized. A finite-state encoder and sliding block decoder are disclosed, together with logic equations for encoder and decoder circuits.

13 Claims, 3 Drawing Sheets

EVEN MARK MODULATION CODING METHOD

CROSS REFERENCE TO RELATED APPLICATIONS

U.S. Applications Ser. Nos. 07/169,919 and 169,920, filed concurrently with this application, disclose other techniques for improving coding gain on partial response channels and different most probable sequence calculations for the outputs.

TECHNICAL FIELD

This invention relates to techniques for transmission of binary digital data over input-restricted partial response channels using maximum likelihood sequence detection. More particularly, it relates to coding methods employing trellis codes for input-restricted partial response (1+D) and (1+D)² channels which provide significant coding gains compared to alternative codes and are especially suitable for high-density optical storage applications.

The following terms, as herein used, are defined as follows:

1. "(1+D) channel" is the D-transform notation for a linear channel with intersymbol interference, in which the output at time n, $y_n$, is determined by the inputs at time n and n−1 according to the equation:

$$y_n = x_n + x_{n-1}$$

2. "(1+D)² channel" is the D-transform notation for a linear channel with intersymbol interference, in which the output at time n, $y_n$, is determined by the inputs at time n, n−1, and n−2 according to the equation:

$$y_n = x_n + 2x_{n-1} + x_{n-2}$$

3. "Trellis codes" refers to codes whose sequences are described by a trellis diagram which is typically used in the derivation of a maximum likelihood sequence detector according to dynamic programming principles.

4. "Coding gain" of a code is a measure of the effective increase in signal-to-noise ratio provided by the use of the code. It reflects the amount by which the signal-to-noise ratio in the coded channel can be reduced relative to the uncoded channel without suffering a degradation in probability of error.

5. "Difference metric" means the difference between the path metrics corresponding to a pair of survivor paths in the maximum likelihood detection algorithm.

6. "Free distance" is the minimum distance between any pair of trellis code or channel output sequences generated by a pair of paths through the trellis diagram which start at the same state and end at the same state.

7. "EMM worst-case paths" refers to any pair of paths through the Even Mark Modulation trellis (for a specified partial response channel) which generate sequences having distance equal to the free distance. "Worst-case paths" is synonymous with "minimum distance paths".

8. "Path extension" is the operation of extending the length of survivor paths in the trellis during the course of the maximum likelihood detection algorithm.

BACKGROUND OF THE INVENTION

U.S. application Ser. No. 06/874,041, filed June 13, 1986, now abandoned and refiled on Mar. 30, 1988, as continuation-in-part application Ser. No. 07/175,171 assigned to the assignee of the present invention, describes an asymmetrical run-length-limited (RLL) code suitable for optical storage. However, this code provides no coding gain. It requires two or more contiguous NRZ 1 bits, but there is no restraint on the number of NRZ 0 bits.

U.S. Pat. No. 4,413,251, also assigned to the assignee of the present invention, discloses a method for generating a sliding block (1,7) RLL code with a coding rate of ⅔. However, for (1+D) partial response channels, this method provides no coding gain; and for (1+D)² channels, this method provides only a 1.8 dB coding gain. This code is generated by a sequential scheme that maps two bits of unconstrained data into three bits of constrained data.

There is a need for coding techniques which provide coding gains of at least 3 dB unnormalized, and at least 2.2 dB when normalized, for input-restricted (1+D) and (1+D)² channels with respect to existing asymmetric RLL codes and the RLL (1,7) code, and which coding techniques are especially suitable for optical recording.

SUMMARY OF INVENTION

Toward this end and according to the invention, a method is described for coding binary symbol strings to improve reliability of input-restricted binary (1+D) and (1+D)² partial response channels, denoted class 1 and class 2, respectively, which are especially suitable for optical storage applications. This method comprises encoding an input string into a binary code string which meets the constraint that the runs of symbols 1 are even in length, whereas the runs of symbol 0 may be of any length or duration. In optical recording applications, this corresponds to writing marks (symbols 1) which are an even number of symbol intervals in length, referred to herein as Even Mark Modulation (EMM). The EMM signals are detected with a maximum likelihood detector adapted to the particular partial response channel, either class 1 (1+D) or class 2 (1+D)². These detectors may be used in conjunction with any code which implements the aforementioned EMM signalling constraint.

The code preferably has a coding rate of ⅔. The code also preferably limits the maximum run of consecutive zero channel output values, for purposes of timing and gain control. It also eliminates EMM sequences which produce worst-case detector performance.

For (1+D) partial response channels, a preferred embodiment of the detector uses a maximum likelihood algorithm based upon a three-state trellis structure. For (1+D)² partial response channels, a preferred embodiment of the detector uses a maximum likelihood algorithm based upon a five-state trellis structure. Both of these algorithms obviate the need for renormalization of metrics by incorporating an appropriate difference metric calculation.

DESCRIPTION OF PREFERRED EMBODIMENTS

General

The modulation and coding technique, termed Even Mark Modulation (EMM), embodying the invention improves the performance of optical recording channels that utilize partial response class 1 (1+D) or class 2 (1+D)² signalling, and exploits the inherent asymmetry between recorded marks and mark spacings.

Figure 1:
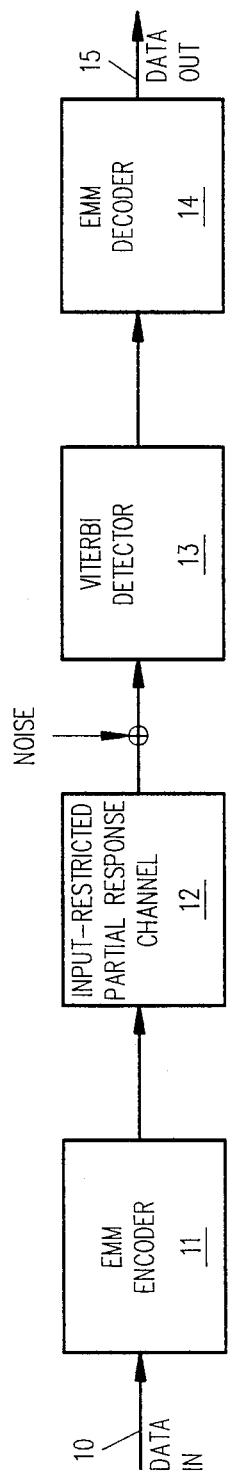
FIG. 1 is a block diagram of a recording system employing a trellis coding technique according to the invention.

Referring to FIG. 1, input data, such as in the form of binary symbol strings, is transmitted from a bus 10 to an eight-state encoder 11. Encoder 11 produces a binary code symbol sequence which serves as input to an input-restricted partial response channel 12. This binary code sequence satisfies the EMM constraint hereinafter defined. A channel output sequence is generated by partial response channel 12 and detected at the channel output by an EMM detector 13. This detector calculates the most probable EMM sequence from the channel output sequence. Detector 13 reduces computational and hardware requirements by tracking the EMM constraint, thereby producing a near maximum-likelihood estimate (or most probable EMM sequence) of the transmitted original data sequence supplied via bus 10. A decoder 14 then generates, from the detected sequence, the EMM code output data in a bus 15. The decoder 14 is a sliding block decoder with a window size of ten code bits, providing maximum error propagation of no more than eight user bits.

Figure 2:
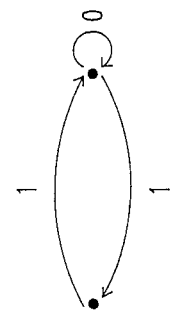
FIG. 2 is a state diagram for EMM input sequences.

The EMM technique is based upon the use of input sequences that are shown in FIG. 2 and satisfy the following EMM constraint—the written marks (NRZ symbols "1") must be in one or more pairs, whereas the spaces (NRZ symbols "0") need not be in pairs. This EMM constraint is a special subset of the asymmetric NRZ$(d',k')-(e',m')=(1,\infty)-(2,\infty)$ constraint necessary to meet the input restrictions for a partial response channel especially suitable for optical recording.

It has been found that applicants' mark modulation technique will not provide coding gains if there is an odd number of consecutive symbols "1" and/or the runs of symbol 1's consist of contiguous n-tuples, where n is an odd number. It is for this reason that the technique is termed Even Mark Modulation.

Figure 3:
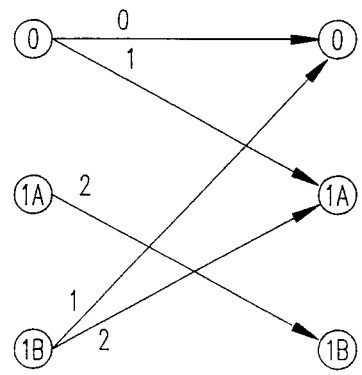
FIG. 3 is a detector trellis diagram for EMM with a class 1 (1+D) partial response channel.

The Viterbi decoding algorithm used by the detector 13 for maximum likelihood sequence estimation of EMM signals on a (1+D) channel is based upon the three-state trellis diagram shown in FIG. 3. The (1+D)² algorithm requires the five-state trellis depicted in FIG. 4. These diagrams are obtained from "higher-block" representations of the EMM constraint. Details will presently be provided of bounded "difference metric" formulations of the EMM Viterbi decoding algorithms for the (1+D) and (1+D)² channels.

According to the invention, use of applicants' unique EMM Viterbi decoding techniques provides a significant increase in coding gains for input-restricted (1+D) and (1+D)² channels compared to the modulation methods disclosed in the above-cited prior art. A significant improvement in performance is achieved, whether or not the coding gain is normalized with respect to the code rate. The improved coding gain is achieved by increasing the free Euclidean distance among valid EMM sequences, as will now be described. A rate ⅔ EMM sliding block code is disclosed which satisfies asymmetric NRZ constraint $(d',k')-(e',m')=(1,8)-(2,12)$ that corresponds to the NRZI constraint $(d,k)-(e,m)=(0,7)-(1,11)$. The rate of the rate ⅔ EMM code is substantially equal to the maximum modulation rate for EMM (i.e., $c \approx 0.694$), thus achieving over 96% efficiency. The rate ⅔ EMM code has the same free distance as the full EMM constraint with (1+D) and (1+D)² channels.

With the trellis shown in FIG. 3 for EMM with a (1+D) channel, the free distance is $d_{free}^2=4$, whereas the free distance of an uncoded (1+D) channel is $d_{free}^2=2$. An example of EMM worst-case paths which still achieve this distance of 4 is:

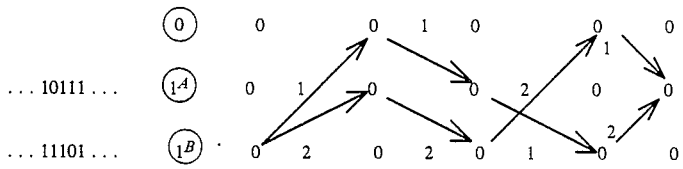

The increase in free distance for the (1+D) channel thus represents a coding gain, unnormalized for rate loss, of $$CG = 10 \log_{10} (4/2) \approx 3.0 \text{ dB}.$$

By contrast, even when normalized with respect to a rate 4/5 asymmetric code incorporating prior art asymmetric run length limitations, the coding gain using rate ⅔ EMM code is still $$ACG = 10 \log_{10} (5/6)(4/2) \approx 2.2 \text{ dB}.$$

(This normalized coding gain is calculated by reducing the free distance by an amount that reflects the code rates; i.e., as illustrated, by dividing ⅔ by 4/5, giving a proportionality factor of 5/6.)

On the other hand, when applicants' rate ⅔ EMM code is compared to the rate ⅔, (1,7) code of the prior art for the (1+D) channel, coding gain desirable becomes $$CG = 10 \log_{10} (4/2) \approx 3.0 \text{ dB}$$

(Note that there is not rate loss with respect to the (1,7) code because the rates of both codes are ⅔.)

In similar manner, it will now be shown that improved coding gains are achieved using applicants' EMM techniques with a (1+D)² channel.

Figure 4:
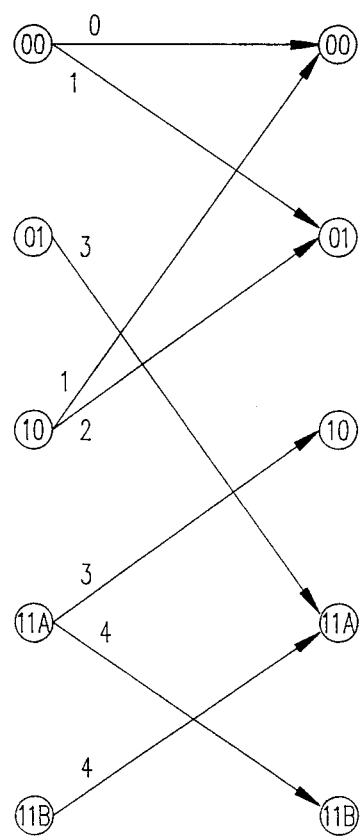
FIG. 4 is a detector trellis diagram for EMM with a class 2 (1+D)² partial response channel.

With the trellis shown in FIG. 4 for EMM with a (1+D)² channel, the free distance is $d_{free}^2=10$, whereas the free distance for an uncoded (1+D)² channel is 4. An example of EMM worst-case paths which still achieve this distance of 10 is:

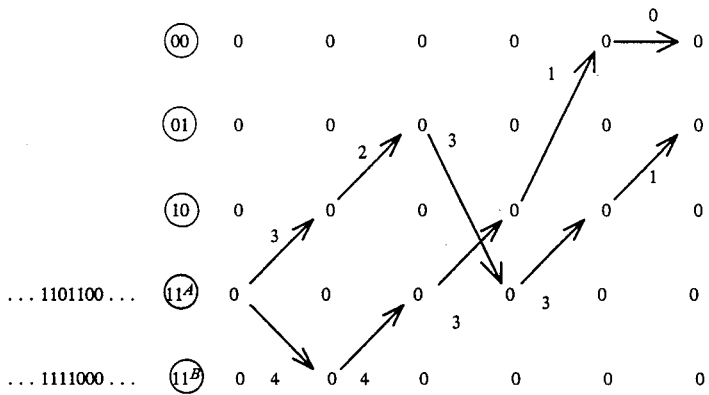

The increase in free distance for the $(1+D)^2$ channel thus represents a coding gain, unnormalized for rate loss, of $$CG = 10 \log_{10} 10/4 \approx 4.0 \text{ dB}.$$

Even when normalized, the EMM coding gain, calculated in the same manner just described, becomes $$ACG = 10 \log_{10} (5/6)(10/4) \approx 3.2 \text{ dB}.$$

On the other hand, when applicants' rate $\frac{2}{3}$ EMM code is compared to rate $\frac{2}{3}$, (1,7) code of the prior art for the $(1+D)^2$ channel, the coding gain is reduced to $$CG = 10 \log_{10} 10/6 \approx 2.2 \text{ dB}$$

because the (1,7) code has a free distance of 6 for the $(1+D)^2$ channel. Again, there is no rate loss because both code rates are the same.

Viterbi Detector for EMM with (1+D) Channels

According to one embodiment of the invention, detector 13 embodies a difference metric Viterbi decoding algorithm for EMM on a $(1+D)$ channel. The bounds, as computed, on the size of the difference metrics desirably lead to a decoder implementation that does not require renormalization.

Figure 5:
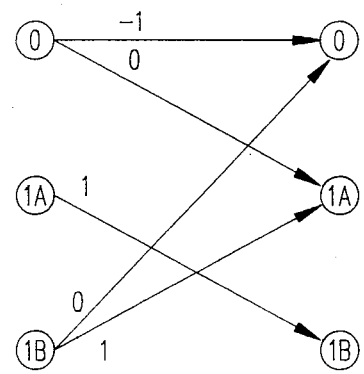
FIG. 5 is a normalized detector trellis diagram for EMM with a (1+D) partial response channel.

FIG. 5 shows the three-state trellis upon which the Viterbi decoding algorithm operates. The $(1+D)$ channel output symbols have been normalized from $\{0,1,2\}$ to $\{-1,0,1\}$ by setting $z = y - 1$.

To determine the optimal path extensions, it is necessary to keep track of only the difference survivor metrics, $DJ_n(2,1)$ and $DJ_n(3,1)$. Of the four potential path extension cases, only three actually can occur. These path extensions, as well as the corresponding difference metric conditions which govern their selection and the resulting difference metric updates are shown in Table 1 below. The conditions take the form of inequalities involving the quantity $$p_n = DJ_{n-1}(3,1) - 2z_n$$

which depends only on the difference metric value $DJ_{n-1}(3,1)$ at step $n-1$ and the normalized channel output sample $z_n$ at time n.

TABLE 1

| | Difference Metric Algorithm for EMM with (1 + D) Channels | |
|---|---|---|
| Inequality | Updates | Extension |
| $p_n \geq 1$ | $DJ_n(2,1) = -2z_n - 1$ $DJ_n(3,1) = -DJ_{n-1}(2,1) - 4z_n$ | |
| $1 > p_n \geq -1$ | $DJ_n(2,1) = -DJ_{n-1}(3,1)$ $DJ_n(3,1) = DJ_{n-1}(2,1) - DJ_{n-1}(3,1) - 2z_n + 1$ | |

TABLE 1-continued

| Difference Metric Algorithm for EMM with (1 + D) Channels | | |
|---|---|---|
| Inequality | Updates | Extension |
| $-1 > p_n$ | $DJ_n(2,1) = -2z_n + 1$<br>$DJ_n(3,1) = DJ_{n-1}(2,1) - DJ_{n-1}(3,1) - 2z_n + 1$ | (0)→(0), (1A)→(1A) with 1, (1B)→(1B) with 0,1 (crossing) |

With the output sample normalization mentioned above, it can be assumed that the digitized signal samples fall in a range $[-A,A]$. A known methodology then provides these bounds on the quantities $DJ_n(2,1)$ and $DJ_n(3,1)$:

$$-2A-1 \leq DJ_n(2,1) \leq 2A+1$$

$$-6A-1 \leq DJ_n(3,1) \leq 6A+1$$

For example, with $A=4$, the bounds show that $DJ_n(2,1) \in [-9,9]$ and $DJ_n(3,1) \in [-25,25]$. If there are $L=2^r$ quantization levels between ideal sample values, at most $5+r$ magnitude bits and 1 sign bit are required to store the difference metrics. Computer simulations establish that this is also the minimum number of bits that will suffice to retain the metrics.

Viterbi Detector for EMM with $(1+D)^2$ Channels

According to another embodiment of the invention, detector 13 embodies a different difference metric Viterbi decoding algorithm for EMM on a $(1+D)^2$ channel. The bounds, as computed, on the size of the difference metrics likewise desirably lead to a decoder implementation that does not require renormalization.

Figure 6:
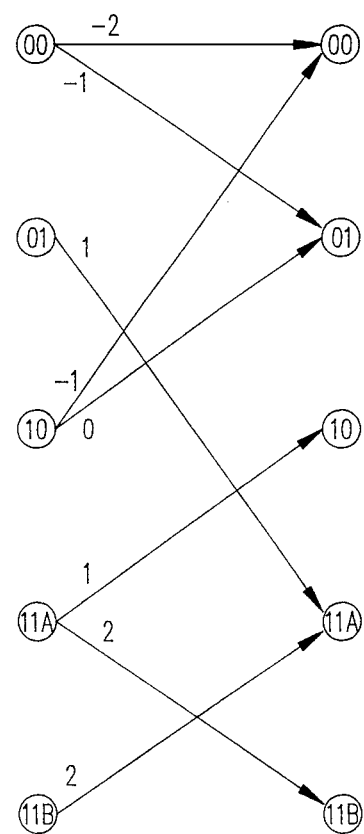
FIG. 6 is a normalized detector trellis diagram for EMM with a (1+D)² partial response channel.

FIG. 6 shows the five-state trellis upon which this Viterbi decoding algorithm operates. The $(1+D)^2$ output symbols have been normalized from $\{0,1,2,3,4\}$ to $\{-2,-1,0,1,2\}$ by setting $z=y-2$.

To determine the optimal path extensions, it is necessary to keep track of only the difference survivor metrics, $DJ_n(3,1)$, $DJ_n(5,2)$, $DJ_n(4,1)$ and $DJ_n(3,2)$. Of the eight potential path extension cases, only six actually can occur. These path extensions, as well as the corresponding difference metric conditions which govern their selection are shown in Table 2 below. The difference metric updates are shown in Table 3. The conditions take the form of inequalities involving the quantities $$p_n = DJ_{n-1}(3,1) - 2z_n \text{ and } q_n = DJ_{n-1}(5,2) - 2z_n$$

which depend only on the difference metric values $DJ_{n-1}(3,1)$ and $DJ_{n-1}(5,2)$ at step $n-1$ and the normalized channel output sample $z_n$.

TABLE 2

| Path Extension Conditions for EMM with $(1 + D)^2$ Channels | |
|---|---|
| Inequality | Path Extension |
| (A1) $p_n \geq 3$ | (00)→(00) with $-2$; (00)→(01) with $-1$; (10)→(01) |
| (A2) $3 > p_n \geq 1$ | (00)→(00) with $-1$; (10)→(00), (10)→(01), (00)→(01) with $-1$ |
| (A3) $1 > p_n$ | (00)→(00); (10)→(00) with $-1$; (10)→(01) with 0 |
| (B1) $q_n \geq -3$ | (01)→(11A) with 1; (11B)→(11A) |
| (B2) $-3 > q_n$ | (01)→(11A); (11B)→(11A) with 2 |
| Unconditional | (11A)→(10) with 1; (11A)→(11B) with 2 |

TABLE 3

| Difference Metric Updates for EMM with $(1 + D)^2$ Channels | | |
|---|---|---|
| $DJ_n(3,1) =$ | $DJ_{n-1}(4,1) - 6z_n - 3$ | if A1 |
| $=$ | $DJ_{n-1}(4,1) - DJ_{n-1}(3,1) - 4z_n$ | if A2 $\vee$ A3 |
| $DJ_n(5,2) =$ | $DJ_{n-1}(4,1) - 6z_n + 3$ | if A1 $\vee$ A2 |
| $=$ | $DJ_{n-1}(4,1) - DJ_{n-1}(3,1) - 4z_n$ | if A3 |
| $DJ_n(3,2) =$ | $DJ_{n-1}(4,1) - 4z_n$ | if A1 $\vee$ A2 |
| $=$ | $DJ_{n-1}(4,1) - DJ_{n-1}(3,1) - 2z_n + 1$ | if A3 |
| $DJ_n(4,1) =$ | $DJ_{n-1}(3,1) - DJ_{n-1}(3,2) - 6z_n - 3$ | if A1 $\wedge$ B1 |
| $=$ | $DJ_{n-1}(3,1) + DJ_{n-1}(5,2) - DJ_{n-1}(3,2) - 8z_n$ | if A1 $\wedge$ B2 |
| $=$ | $-DJ_{n-1}(3,2) - 4z_n$ | if (A2 $\vee$ A3) $\wedge$ B1 |
| $=$ | $DJ_{n-1}(5,2) - DJ_{n-1}(3,2) - 6z_n + 3$ | if (A2 $\vee$ A3) $\wedge$ B2 |

With the output sample normalization mentioned above, it can be assumed that the digitized signal samples fall in a range $[-A,A]$. Again, the methodology heretofore described in connection with the $(1+D)$ channel provides these bounds on the quantities $DJ_n(3,1)$, $DJ_n(5,2)$, $DJ_n(3,2)$ and $DJ_n(4,1)$.

$$-14A-9 \leq DJ_n(3,1) \leq 14A+3$$

$$-14A-3 \leq DJ_n(5,2) \leq 14A+9$$

$$-12A-6 \leq DJ_n(3,2) \leq 12A+6$$

$$-8A-6 \leq DJ_n(4,1) \leq 8A+6$$

For example, with A=4, the bounds show that $$DJ_n(3,1) \in [-65,59],$$

$$DJ_n(5,2) \in [-59,65],$$

$$DJ_n(3,2) \in [-54,54] \text{ and}$$

$$DJ_n(4,1) \in [-38,38].$$

Therefore, with $L=2^r$ quantization levels between ideal sample values, $7+r$ magnitude bits and 1 sign bit are sufficient to store the difference metrics. Since we have found that computer simulations generated a maximum metric value of only $DJ(5,2) \approx 55.2$, it may be possible to improve the bounds and reduce the required number of magnitude bits by 1.

Pairs of EMM sequences which terminate in all 1's will generate zero additional Euclidean distance over an unbounded number of symbols. These sequences are therefore susceptible to degraded performance during the detection process. The EMM code has therefore been designed with a constraint on the maximum run of 1's to eliminate EMM sequences which produce worst-case performance.

Also, EMM sequences which contain long runs of 0's generate corresponding long runs of zero output samples on class 1 and class 2 partial response channels. These sequences are more likely to produce errors in timing recovery and gain control. The EMM code has therefore been designed with a constraint on the maximum number of 0's to eliminate EMM sequences which degrade timing recovery and gain control.

These constraints on the maximum runs of 1's and 0's are embodied in Table 4. Table 4 is an encoder table for rate ⅔ EMM code with asymmetric run-length-limited (ARLL) NRZ constraints $(d',k')-(e',m')=(1,8)-(2,12)$. The finite-state encoder has 8 states. Entries in this table are in the form $c_1c_2c_3/t_1t_2t_3$ where $c_1c_2c_3$ is the codeword generated, and $t_1t_2t_3$ is the next encoder state. As depicted in Table 4, the ARLL constraints limit runs of 1's corresponding to a maximum of 6 contiguous pairs of 1's in any EMM code sequence and runs of 0's to a maximum of 8 consecutive 0's in any EMM code sequence.

TABLE 4

| | Encoder Table for EMM Code | | | |
|---|---|---|---|---|
| | 00 | 01 | 10 | 11 |
| Data $b_1b_2$ State $s_1s_2s_3$ | Codeword/ Next State | Codeword/ Next State | Codeword/ Next State | Codeword/ Next State |
| 000 | 011/000 | 011/001 | 110/000 | 110/001 |
| 001 | 001/100 | 001/101 | 110/010 | 011/110 |
| 010 | 000/000 | 000/011 | 111/100 | 111/101 |
| 011 | 001/100 | 001/101 | 111/100 | 111/101 |
| 100 | 100/000 | 100/001 | 101/100 | 101/101 |
| 101 | 111/000 | 111/001 | 100/010 | 111/111 |
| 110 | 000/000 | 000/001 | 111/100 | 111/101 |
| 111 | 000/000 | 000/001 | 111/100 | 000/010 |

The Boolean logic equations for the output codeword $c_1c_2c_3$ and the next state $t_1t_2t_3$ are as follows:

Output Codeword $c_1c_2c_3$ $$c_1 = \bar{b}_1 s_1 \bar{s}_2 + b_1(\bar{s}_3 + \bar{s}_1 s_2) + b_1 \bar{b}_2 s_3(s_1 + \bar{s}_2) + b_1 b_2 s_1 \bar{s}_2 s_3$$

$$c_2 = \bar{b}_1(s_1 \bar{s}_2 s_3 + \overline{s_1 s_2 s_3}) + b_1(\overline{s_1 s_3} + \bar{s}_1 s_2 + s_2 \bar{s}_3) + b_1 \bar{b}_2(s_1 s_2 s_3 + \overline{s_1 s_2 s_3}) + b_1 b_2 \bar{s}_2 s_3$$

$$c_3 = \bar{b}_1(\overline{s_1 s_2} + \bar{s}_1 s_3 + s_2 \bar{s}_3) + b_1(s_1 \bar{s}_3 + s_2 \bar{s}_3 + \bar{s}_1 s_2) + b_1 \bar{b}_2 s_1 s_2 s_3 + b_1 b_2 \bar{s}_2 \bar{s}_3$$

Next State $t_1t_2t_3$
Intermediate Functions $$E = s_1 + \bar{s}_2 \bar{s}_3$$

$$F = \bar{s}_2(\bar{s}_1 + s_3)$$

Next State Functions $$t_1 = \bar{b}_1 s_3 \bar{E} + b_1 \bar{b}_2 \bar{F} + b_1 b_2(s_1 s_2 s_3 + \overline{s_1 s_2 s_3})$$

$$t_2 = \bar{b}_1 b_2 \bar{s}_3 \bar{E} + b_1 \bar{b}_2 \bar{s}_2 s_3 + b_1 b_2(\bar{s}_2 s_3 + s_1 s_3)$$

$$t_3 = \bar{b}_1 b_2 + b_1 b_2(s_3 + s_1 \bar{s}_2 + \bar{s}_1 s_2)$$

The rate ⅔ EMM code has a sliding block decoder that requires a decoding window of 10 code bits, involving 1 bit of look-back and 6 bits of look-ahead. Decoded bits $b_1$ and $b_2$ are therefore functions of the look-back bit $c_0$, the current codeword $c_1c_2c_3$, and the look-ahead code words $c_4c_5c_6$ and $c_7c_8c_9$.

Decoded Data $b_1b_2$
Intermediate Functions $$G = c_4 c_5 c_6 + \bar{c}_4 \bar{c}_5 \bar{c}_6$$

$$H = c_7 c_8 c_9 + \bar{c}_7 \bar{c}_8 \bar{c}_9$$

Data Functions $$b_1 = (c_0(c_1 + c_2 + \bar{c}_3) + \bar{c}_0(c_1 + c_2)) G + c_1 c_4 \bar{c}_5 + c_1(c_2 \bar{c}_3 + \bar{c}_2 c_3)$$

$$b_2 = \bar{c}_4 \bar{c}_5 c_6 + (\bar{c}_1 + c_3) G + (\bar{c}_1 + c_3)(\bar{c}_4 + c_5 + c_6) H + (\bar{c}_4 + \bar{c}_6)(c_4 + c_5 + c_6) H$$

While the invention has been shown and described with reference to preferred embodiments thereof, it will be understood by those skilled in the art that changes in form and detail may be made therein without departing from the spirit, scope and teaching of the invention. Accordingly, the method herein disclosed is to be considered merely as illustrative and the invention is to be limited only as specified in the claims.

What is claimed is:

1. A method for coding input strings for a binary $(1+D)$ or $(1+D)^2$ partial response channel that requires at least two consecutive signals of one state in order to record or transmit data to a receiving device, comprising the steps of:
   encoding an input string into a binary code string according to an even mark modulation (EMM) constraint in which all one-state signals are in pairs, and signals of an opposite state need not be in pairs;
   for a $(1+D)$ partial response channel, using a maximum liklihood detection algorithm based upon a three-state trellis structure; and
   for a $(1+D)^2$ partial response channel, using a maximum likelihood detection algorithm based upon a five-state trellis structure.

2. The method according to claim 1, wherein said one-state signals are in runs of a plurality of contiguous pairs.

3. The method of claim 1, wherein the maximum run of consecutive one-state state signals is limited to eliminate sequences that require unbounded path memory in a maximum likelihood detection algorithm to achieve optimal detection.

4. The method of claim 1,
wherein the three-state trellis structure incorporates a difference metric calculation to obviate the need for renormalization of metrics.

5. The method of claim 1,
wherein the three-state trellis structure incorporates a difference metric calculation to obviate the need for renormalization of metrics.

6. The method of claim 1, wherein the signals of opposite state are in runs of limited length to improve timing and gain control by limiting the maximum run of consecutive channel output values.

7. The method of claim 1, wherein signals of said opposite state may be in runs of any length or duration.

8. The method of claim 1, wherein the binary code has an unnormalized coding gain of at least 3 dB with respect to the uncoded channel.

9. The method of claim 1, wherein the binary code has a coding rate of $\frac{2}{3}$.

10. The method of claim 3, wherein the maximum run of one-state signals is six consecutive pairs.

11. The method of claim 1, including the further steps of:
supplying to the channel the binary code string satisfying the EMM constraint;
generating a channel output sequence; and
detecting a most probable EMM sequence from the channel output sequence.

12. The method of claim 11, including the further step of decoding the most probable EMM sequence for generating EMM code output data.

13. The method of claim 11, wherein there are no more than eight consecutive signals of said oppsite state in the channel output sequence.

* * * * *